United States Patent
Tsukuda et al.

(10) Patent No.: US 8,363,421 B2
(45) Date of Patent: Jan. 29, 2013

(54) SEMICONDUCTOR DEVICE HAVING WIRING FORMED ON WIRING BOARD AND ELECTRIC CONDUCTOR FORMED IN WIRING BOARD AND CONDUCTOR CHIP FORMED OVER WIRING

(75) Inventors: Tatsuaki Tsukuda, Kanagawa (JP); Masayoshi Hirata, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 337 days.

(21) Appl. No.: 12/382,599

(22) Filed: Mar. 19, 2009

(65) Prior Publication Data
US 2009/0244869 A1    Oct. 1, 2009

(30) Foreign Application Priority Data

Apr. 1, 2008 (JP) .................. 2008-094491

(51) Int. Cl.
*H05K 7/02* (2006.01)
*H05K 1/02* (2006.01)
(52) U.S. Cl. ........ 361/783; 361/760; 361/764; 361/780; 174/255
(58) Field of Classification Search .................. 361/760, 361/783, 794, 799, 800, 764, 780; 174/255, 174/260
See application file for complete search history.

(56) References Cited

U.S. PATENT DOCUMENTS

| | | | | |
|---|---|---|---|---|
| 6,800,814 | B2 * | 10/2004 | Ohsaka | 174/261 |
| 6,937,480 | B2 * | 8/2005 | Iguchi et al. | 361/780 |
| 7,199,308 | B2 * | 4/2007 | Ohsaka | 174/261 |
| 7,259,968 | B2 * | 8/2007 | Wright | 361/794 |
| 7,436,056 | B2 | 10/2008 | Cheung et al. | |
| 7,518,884 | B2 * | 4/2009 | Wright | 361/794 |
| 7,919,804 | B2 * | 4/2011 | Horn et al. | 257/310 |
| 2006/0071840 | A1 | 4/2006 | Cheng et al. | |
| 2007/0102806 | A1 * | 5/2007 | Horn et al. | 257/698 |
| 2008/0073107 | A1 * | 3/2008 | Honjo | 174/250 |
| 2009/0084592 | A1 * | 4/2009 | Tsukuda et al. | 174/260 |

FOREIGN PATENT DOCUMENTS

| | | | |
|---|---|---|---|
| JP | 05075313 A | * | 3/1993 |
| JP | 6-244305 | | 9/1994 |
| JP | 2006-86505 | | 3/2006 |
| JP | 2007-287916 A | | 11/2007 |

OTHER PUBLICATIONS

Notification of Reasons for Refusal dated Jan. 25, 2012 (with an English translation).
Japanese Office Action dated Oct. 2, 2012 with English translation thereof.

* cited by examiner

*Primary Examiner* — Robert J Hoffberg
(74) *Attorney, Agent, or Firm* — McGinn IP Law Group, PLLC

(57) ABSTRACT

A semiconductor device has a wiring board having a wiring, a semiconductor chip that is mounted on the wiring board, and an electric conductor reference plane provided in the inside of the wiring board, in which in top view. The wiring includes a first region that overlaps the electric conductor reference plane and a second region that is the whole region except for the first region. A conductor chip is mounted above the second region.

19 Claims, 12 Drawing Sheets

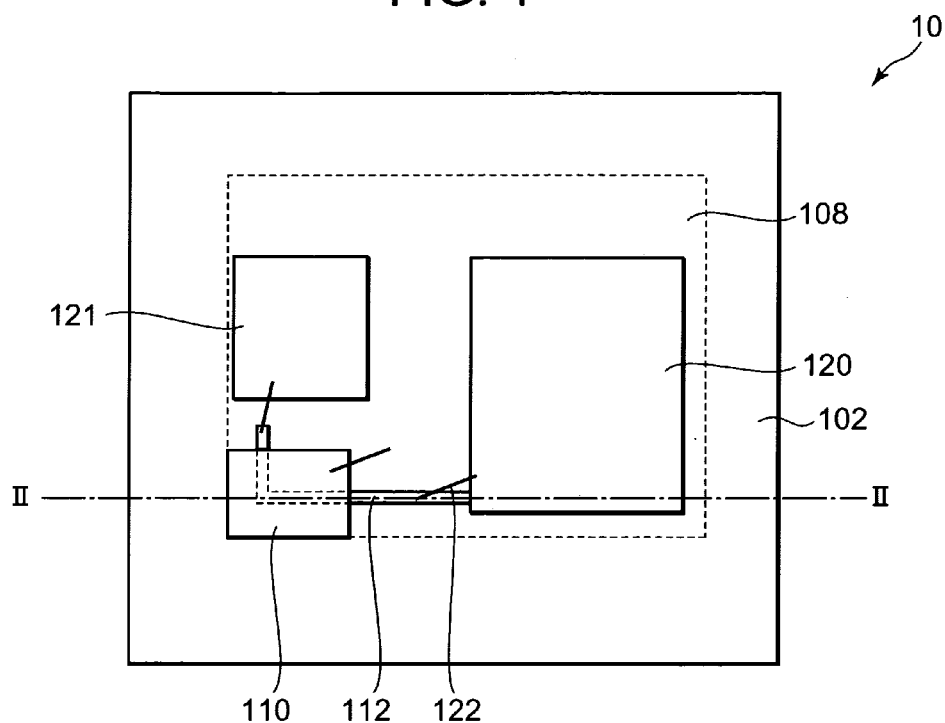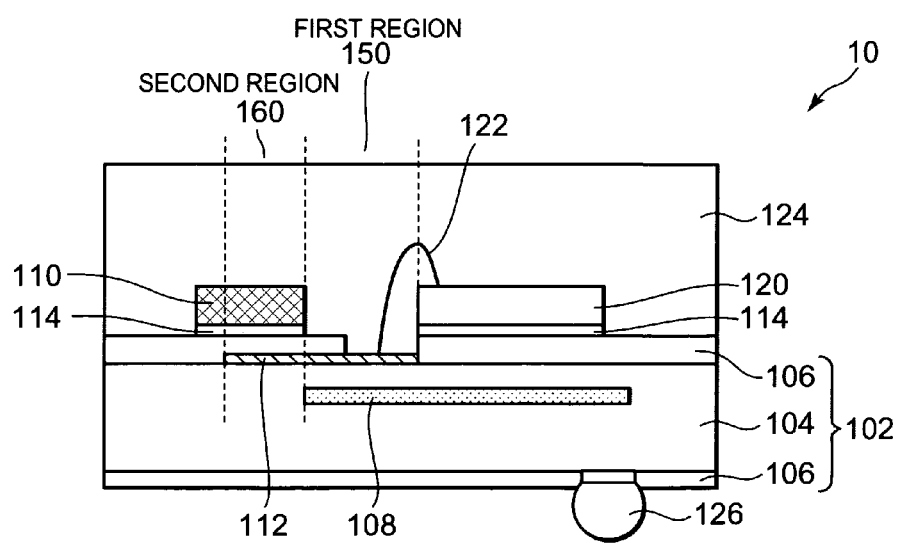

RELATED ART    FIG. 15
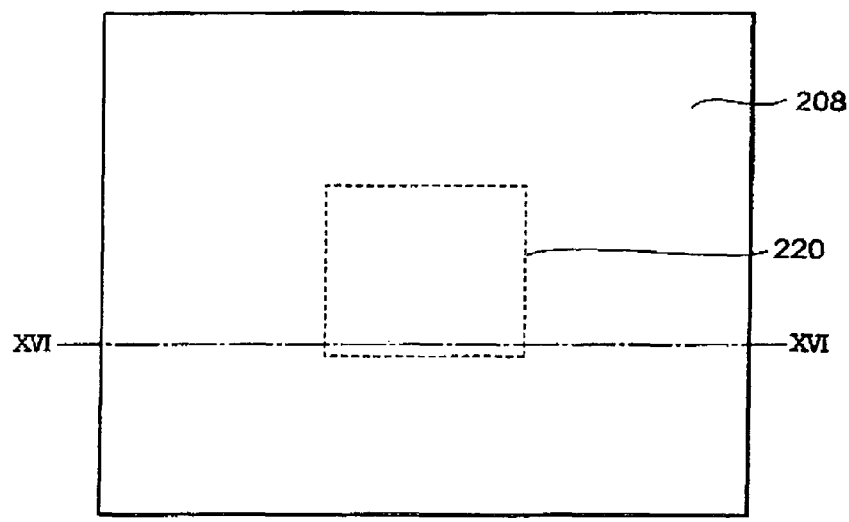
RELATED ART    FIG. 16
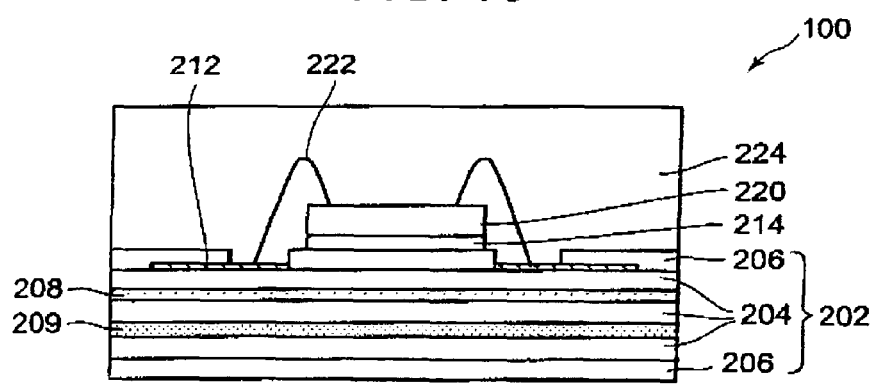

RELATED ART FIG. 17
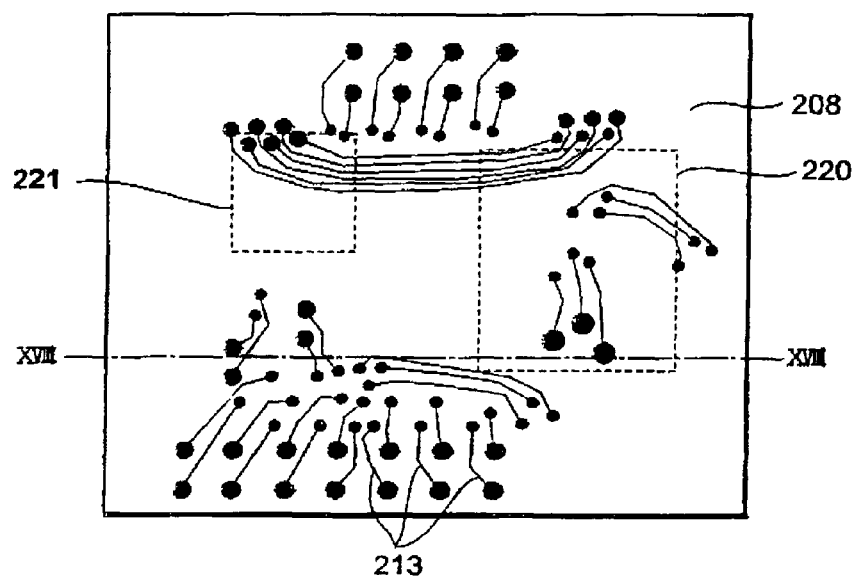
RELATED ART FIG. 18
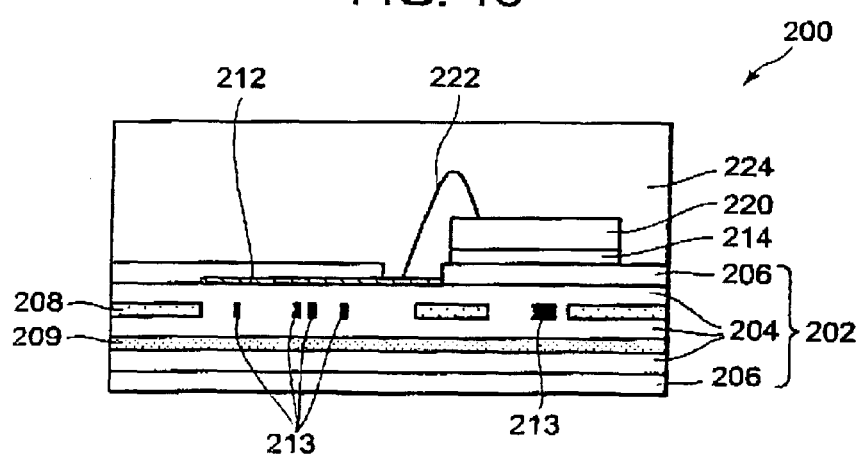

SEMICONDUCTOR DEVICE HAVING WIRING FORMED ON WIRING BOARD AND ELECTRIC CONDUCTOR FORMED IN WIRING BOARD AND CONDUCTOR CHIP FORMED OVER WIRING

BACKGROUND OF THE INVENTION

1. Field of the Invention

The present invention relates to a semiconductor device and a wiring board.

2. Description of Related Art

FIG. 16 is a sectional view showing a configuration of a semiconductor device of a related art. A semiconductor device 100 has an interposer 202 and a single semiconductor chip 220. On the interposer 202, the semiconductor chip 220 is mounted with its circuit formation plane facing upward with a mount material 214. The semiconductor chip 220 is encapsulated with mold resin 224.

The interposer 202 includes an insulating layer 204 in which a plurality of wirings 212 are provided and solder resist 206 that covers its rear surface. Moreover, a power supply/ground layer 208 is provided in a layer in the inside of the insulating layer 204. An exposed part of the wiring 212 and a circuit (not illustrated) on the semiconductor chip 220 are electrically connected together by a wire 222.

FIG. 15 is a plan view of the power supply/ground layer 208. A sectional view taken along the line XVI-XVI of FIG. 15 corresponds to FIG. 16.

When letting an electric signal pass through the wiring 222, impedance matching needs to be achieved over the whole length of the wiring. If the impedance matching is not achieved, then reflection of the signal and waveform distortion will arise and a transmission characteristic will deteriorate. An influence of impedance mismatching is great especially when transmitting a high speed signal.

In the semiconductor device 100, the plurality of wirings 222 have fixed characteristic impedance with respect to the power supply/ground layer 208 in the inside of the wiring board 208 acting as an electric conductor reference plane, and the impedance matching is achieved over the whole length of the wiring.

Incidentally, as prior art documents relevant to the present invention, Patent Document 1 and Patent Document 2 can be enumerated.

Patent Document 1 is an example of a semiconductor device with a single semiconductor chip mounted thereon, which shows a configuration in which a power supply layer and a ground layer for formation of the characteristic impedance with a strip line structure are provided in the inside of a multilayer ceramic board.

Moreover, Patent Document 2 discloses a configuration that has an analog signal, a digital signal, an analog signal reference (electric conductor reference plane), and a digital signal reference in a board, in which an interval between the analog signal and the analog signal reference is set longer than an interval between the digital signal and the digital signal reference. Patent document 2 insists that this configuration enables desired characteristics of an analog signal and a digital signal to be altered, so that the characteristic impedance matching may be achieved.

[Patent Document 1] Japanese Patent Application Laid Open No. Hei 6 (1994)-244305

[Patent Document 2] Japanese Patent Application Laid Open No. 2006-86505

SUMMARY

However, in recent years, wiring density is increasing because of: increase in the number of signal wirings due to advanced features of semiconductor chips; and increase in the number of signal wirings and lengthening of the signal wiring lengths due to multi-chip support technology, such as SiP (System in Package) and PoP (Package on Package). In connection with this, it is becoming difficult to achieve characteristic impedance matching over the whole length of the wiring.

For example, a configuration of a semiconductor device that has a SiP structure becomes as in FIG. 17 and FIG. 18. FIG. 17 is a plan view of a power supply/ground layer of the semiconductor device with the SiP structure, and FIG. 18 is a sectional view taken along the line XVIII-XVIII of FIG. 17. Semiconductor chips 220, 221 are mounted above a region shown by dotted lines of FIG. 17.

The semiconductor device 200 has the wiring board 202 and the plurality of semiconductor chip 220 and semiconductor chip 221. The wiring board 202 comprises an insulating layer 204, a wiring 212 formed on the rear surface of the insulating layer 204, and a wiring 213 formed in an internal wiring layer, and solder resist 206. Moreover, power supply/ground layers 208, 209 are provided in the wiring layer in the inside of the insulating layer 204. The exposed part of the wiring 212 and a circuit (not illustrated) on the semiconductor chip 220 are electrically connected together by a wire 222.

In the semiconductor device 200, since the plurality of semiconductor chips 220, 221 are mounted, the density of the wiring 212 formed on the surface of the wiring board increases as compared with the case of the single semiconductor chip. Because of this, sufficient wiring cannot be formed only with a rear surface layer of the wiring board 202, and accordingly the wiring 213 needs to be placed even in the inside of the wiring board 202. By this placement, as shown in FIG. 17 and FIG. 18, a part of the power supply/ground layer 208 serving as the electric conductor reference plane of the wiring 212 are divided. For this reason, there exists a region that has the power supply/ground layer 208 acting as the electric conductor reference plane and a region that has the power supply/ground layer 209 acting as the electric conductor reference plane in the wiring 212. Since the distances between the wiring 212 and the power supply/ground layers 208, 209 are different, there appear the regions each of whose characteristic impedance is different from the other in the wiring 212. As a result, there is a problem that mismatching of the characteristic impedance arises in the middle of the wiring, reflection of a signal and distortion of a waveform take place, and a transmission characteristic deteriorates.

This problem becomes especially striking in the case where rise and fall of a signal wave are steep, such as a high-speed digital signal, etc. Therefore, with progress of improvement in the speed of the conductor chip in recent years, the problem has become increasingly serious.

A semiconductor device according to an exemplary aspect of the present invention has a wiring board having a wiring, a semiconductor chip mounted on the wiring board, and an electric conductor reference plane in an inside of the wiring board. The wiring includes a first region that overlaps the electric conductor reference plane and a second region that is the whole region except for the first region, and a conductor chip is mounted above the second region.

Here, the "electric conductor reference plane" means an electric conductor that has a fixed electric potential, and, for example, an interposer and a power supply layer/ground layer in the inside of the printed circuit board can be assigned to it.

Since the conductor chip functions as the electric conductor reference plane in a region where the electric conductor reference plane in the inside of the wiring board and the wiring do not overlap each other by taking such a configuration, the characteristic impedance can be matched over the whole length of the wiring. As a result, the semiconductor device that suppresses the signal reflection and the waveform distortion and has an excellent transmission characteristic can be obtained.

Moreover, a wiring board according to the present invention is a wiring board having at least a single wiring, in which the wiring board has an electric conductor reference plane in a part of the wiring layer in the inside thereof, in top view, the wiring includes a first region where it overlaps the electric conductor reference plane and a second region that is the whole region except for the first region, and a conductor chip is mounted above the second region.

Since the conductor chip functions as the electric conductor reference plane in a region where the electric conductor reference plane in the inside of the wiring board and the wiring do not overlap each other by taking such a configuration, the characteristic impedance can be matched over the whole length of the wiring. As a result, the wiring board that suppresses the signal reflection and the waveform distortion and has an excellent transmission characteristic can be obtained.

According to the exemplary aspect of the present invention, there can be provided the semiconductor device having an excellent transmission characteristic such that the impedance matching is achieved over the whole length of the wiring and the wiring board.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 1 illustrates a plan view showing a first exemplary embodiment of a semiconductor device according to the present invention;

FIG. 2 illustrates a sectional view showing the first exemplary embodiment of the semiconductor device according to the present invention;

FIG. 15 illustrates a plan view of a semiconductor device of a related art;

FIG. 16 illustrates a sectional view of the semiconductor device of the related art;

FIG. 17 illustrates a plan view of the semiconductor device of the related art; and FIG. 18 illustrates a sectional view of the semiconductor device of the related art.

Figure 3:
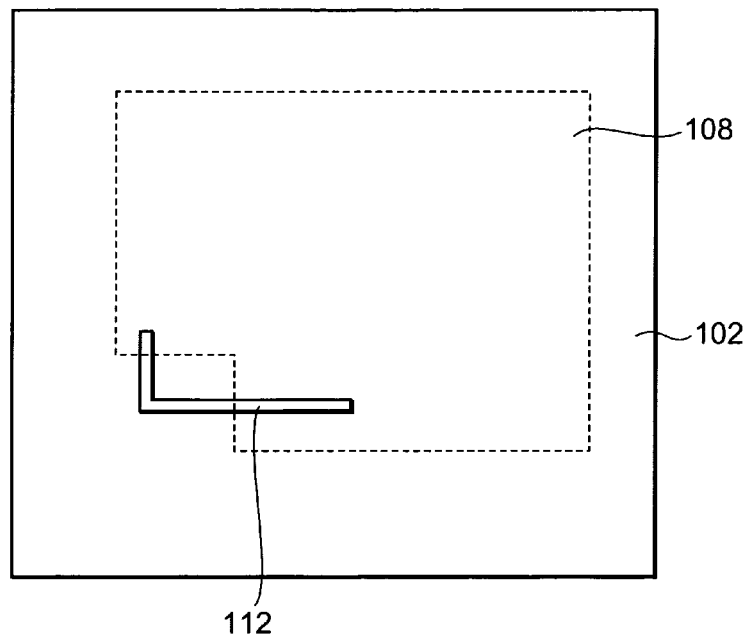
FIG. 3 illustrates a plan view showing the first exemplary embodiment of a wiring board according to the present invention.

DETAILED DESCRIPTION OF THE EXEMPLARY EMBODIMENTS (First Exemplary Embodiment)

FIG. 1 is a plan view showing a configuration of a semiconductor device of an exemplary embodiment. FIG. 2 is a sectional view of a semiconductor device 10 shown in FIG. 1 taken along the line II-II. Note that in FIG. 1, mold resin 124 is not illustrated.

The semiconductor device 10 has a wiring board 102, a semiconductor chip 120, a semiconductor chip 121, and a conductor chip 110. On the wiring board 102, the semiconductor chip 120 and the semiconductor chip 121 are mounted with their circuit formation surfaces facing upwards, with a mount material 114. Moreover, the conductor chip 110 is mounted on the wiring board 102 with the mount material 114.

The semiconductor chip 120 is not particularly limited. For example, it may be specified as an LSI having a logic circuit function, an LSI having a general-purpose memory circuit function, or an LSI having a logic and DRAM integrated circuit function.

The wiring board 102 includes an insulating layer 104 on whose surface a wiring 112 is formed and solder resist 106 for protecting its rear surface. The solder resist 106 is provided with an opening, and a pad (not illustrated) on the semiconductor chip 120 and the wiring 112 are electrically connected together by a wire 122. On a surface opposite to the surface of the wiring board 102 on which the semiconductor chip was mounted, a solder ball 126 is provided.

In the exemplary embodiment, the wiring board 102 can be made as an interposer. That is, it may be further mounted on a printed circuit board with an intermediate of the solder ball 126.

The wiring board 102 has an electric conductor reference plane 108 provided in a part of an internal wiring layer. Here, the "electric conductor reference plane" means an electric conductor that has a fixed electric potential, and it can be specified as a power supply layer or ground layer in the inside of the interposer and the printed circuit board. In this exemplary embodiment, the electric conductor reference plane 108 is the ground layer. Moreover, it is preferable that the electric conductor reference plane has an increased capacity by increasing the area as large as possible, and a variation of the electric potential is made small. As shown in FIG. 1, in the wiring layer, it has a larger area than a total area of the plurality of semiconductor chips 120, 121, and has a stable fixed electric potential.

Moreover, the wiring board 102 is equipped with at least a single wiring 112. The wiring 112 is a signal line. As shown in FIG. 1 and FIG. 2, in top view, the wiring board 102 includes a first region 150 that overlaps the electric conductor reference plane 108 and a second region 160 that is the whole region except for it. Although only one wiring 112 is shown in FIG. 1 for simplification, generally the actual semiconductor device has a plurality of wirings.

The conductor chip 110 is mounted above the second region 160 on the surface of the wiring board 102. The conductor chip 110 is configured to have a fixed electric potential. Specifically, the conductor chip 110 is connected to the power supply potential or the ground potential via a wire, etc. In the exemplary embodiment, the conductor chip 110 is connected to the ground potential via the wire 122 and a wiring (not illustrated).

As shown in FIG. 1 and FIG. 2, in the first region 150, the wiring 112 and the electric conductor reference plane 108 constitute a microstrip line. On the other hand, in the second region, the wiring 112 and the conductor chip 110 constitute the microstrip line.

As the conductor chip 110, for example, a semiconductor into which a metal or impurity is doped, or an insulator on whose surface a metallic film is coated can be used. In this exemplary embodiment, a metallic chip is used as the conductor chip 110.

Figure 4:
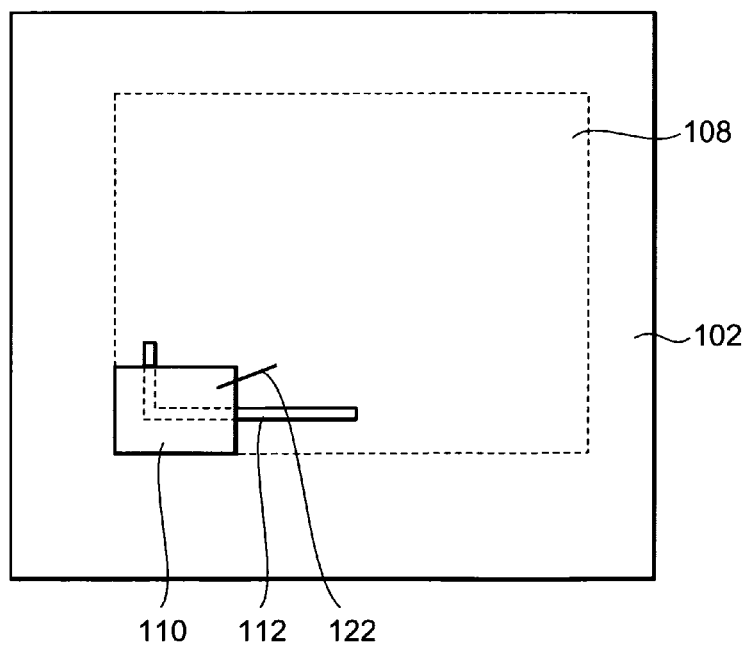
FIG. 4 illustrates a plan view showing the first exemplary embodiment of the wiring board according to the present invention.

Next, a configuration of the wiring board in the exemplary embodiment will be explained in detail using FIG. 3 and FIG. 4. FIG. 3 is a plan view of the wiring board before the semiconductor chip and the conductor chip are mounted. FIG. 4 is a plan view of the wiring board after the conductor chip was mounted. In FIG. 3 and FIG. 4, the electric conductor reference plane 108 is provided in a part of the wiring layer in the inside of the wiring board 102 in a region shown by dotted lines. As shown in FIG. 3, a defective part exists in the electric conductor reference plane 108. Moreover, as shown in FIG. 3, in top view, the wiring 112 includes the first region 150 that overlaps the electric conductor reference plane 108 and the second region 160 that is the whole region except for it. As shown in FIG. 4, above the second region 160, the conductor chip 110 is mounted. The conductor chip 110 is configured to have a fixed electric potential. Specifically, the conductor chip 110 is connected to the power supply potential or the ground potential via the wire 122, etc.

The semiconductor device has an effect that it can provide the semiconductor device having an excellent transmission characteristic such that impedance matching is achieved over the whole length of the wiring and the wiring board. This originates in that characteristic impedance of the wiring is dependent on the distance between the wiring and the electric conductor reference plane. It is based on the following reason.

The characteristic impedance $Z_0$ is given by the following formula where impedance per unit length is denoted by $L_0$, and capacitance per unit length between the electric conductor reference plane and the wiring is denoted by $C_0$.

$$Z_0 = \sqrt{(L_0/C_0)} \; [\Omega] \qquad \text{[Formula 1]}$$

Here, the "electric conductor reference plane" means an electric conductor having a fixed electric potential.

A capacitance C between the electric conductor reference plane and the wiring is given by the well-known formula, where the dielectric constant of vacuum is represented by $\epsilon_0$, a relative dielectric constant of the insulator existing between the wiring and the electric conductor reference plane by $\epsilon_r$, a distance between the electric conductor reference plane and the wiring by d, and a facing area between the electric conductor reference plane and the wiring by S.

$$C = \epsilon_0 \epsilon_r S/d \; [F] \qquad \text{[Formula 2]}$$

In calculating the characteristic impedance, the capacitance per unit length is required. The wiring width being denoted by w (mm) and the distance between the wiring and the electric conductor reference plane being denoted by h (mm), the capacitance $C_0$ for one cm of the wiring length can be obtained by the following formula.

$$C_0 = 10^{-2} \times \epsilon_0 \epsilon_r w/h \; [F] \qquad \text{[Formula 3]}$$

Moreover, the inductance for one cm of the wiring length is given by the following formula that is well known as a formula of the microstrip line.

$$L_0 = 1.97 \times 10^{-9} \times \ln(2\pi h/w) \; [H] \qquad \text{[Formula 4]}$$

With the above preparation, the characteristic impedance $Z_0$ of the wiring can be found by substituting calculation results of (Formula 3) and (Formula 4) into (Formula 1). Therefore, the characteristic impedance of the wiring is dependent on the distance h between the wiring and the electric conductor reference plane. More specifically, the larger the distance h between the wiring and the electric conductor reference plane, the larger the characteristic impedance of the wiring becomes.

In the exemplary embodiment, by mounting the conductor chip 110 on the upper side of a region (the second region 160) where the wiring 122 does not overlap the electric conductor reference plane 108, the semiconductor device having an excellent characteristic such that the impedance matching is achieved over the whole length of the wiring and a wiring board can be provided. This reason is as follows.

Figure 5:
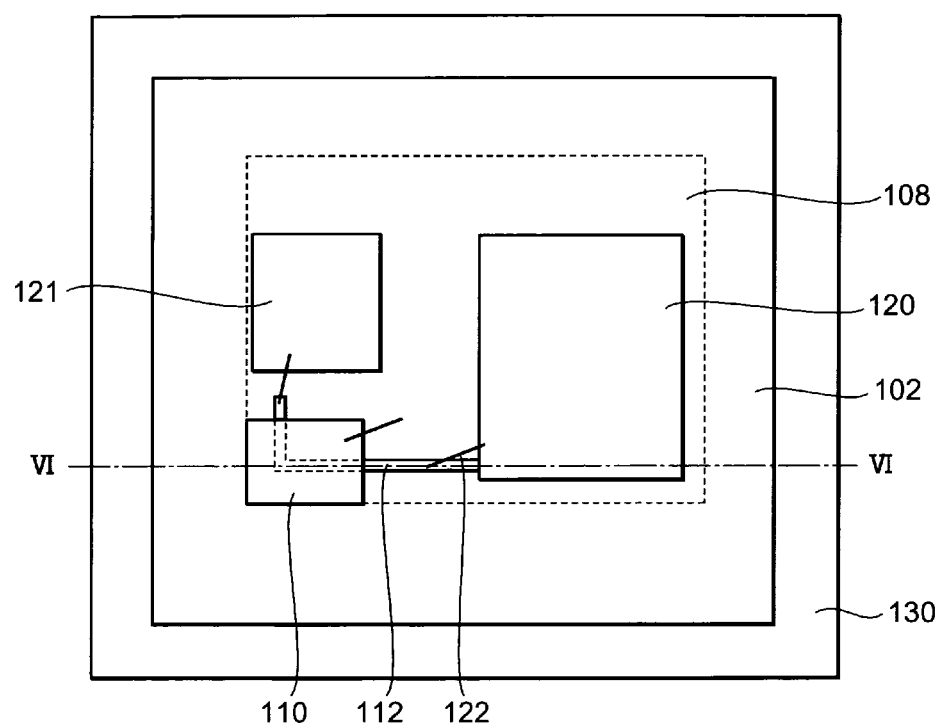
FIG. 5 illustrates a plan view showing the first exemplary embodiment of the semiconductor device according to the present invention.
Figure 6:
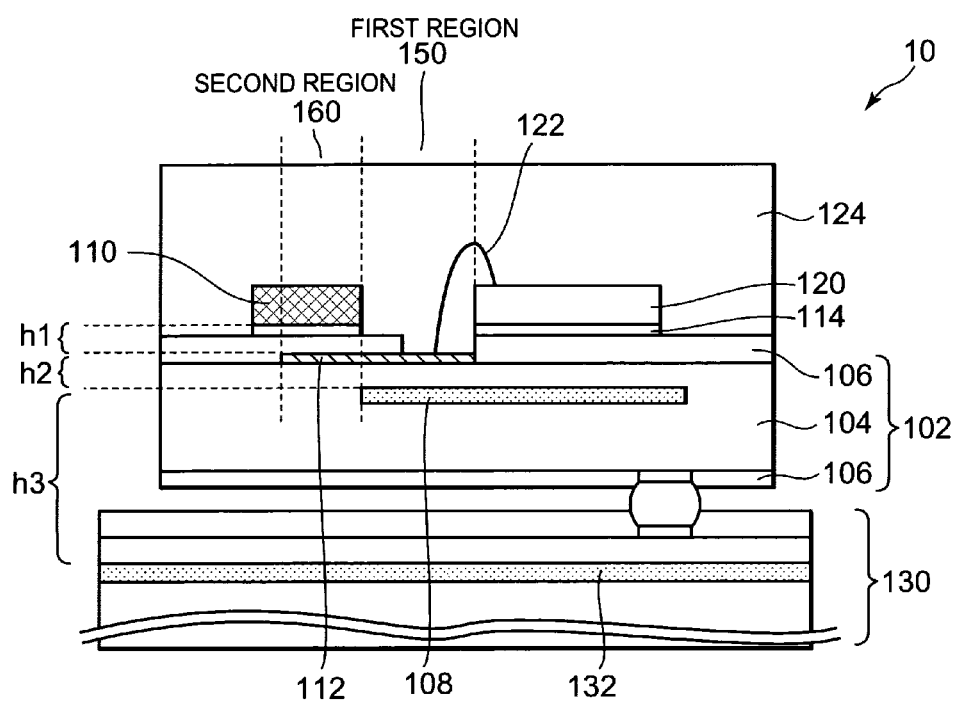
FIG. 6 illustrates a sectional view showing the first exemplary embodiment of the semiconductor device according to the present invention.

FIG. 5 and FIG. 6 are diagrams of the semiconductor device 10 of the exemplary embodiment when it is further mounted on a printed circuit board 130. FIG. 6 is a sectional view taken along the line VI-VI of FIG. 5.

In top view, in the first region 150, the wiring 112 and the electric conductor reference plane 108 constitute the microstrip line. For this reason, the characteristic impedance becomes a value Z(h2) that is obtained by substituting h2 of FIG. 6 into the above-mentioned formulae, (Formula 1), (Formula 3), and (Formula 4). On the other hand, in the case where the conductor chip 110 is not mounted, like the semiconductor device of the related art, in the second region 160, the wiring 112 and an electric conductor reference plane 132 that is provided in the inside of the printed circuit board 130 will constitute the microstrip line. Therefore, the characteristic impedance becomes Z(H) that is a value obtained by substituting H=h2+h3 that is a distance between the electric conductor reference plane 132 provided in the inside of the printed circuit board 130 and the wiring 112 into the above-mentioned formulae, (Formula 1), (Formula 3), and (Formula 4). Usually, h3 is sufficiently larger than h2. Therefore, an inequality Z(h2)<Z(H) holds, and mismatching of the characteristic impedance will occur in the first region 150 and in the second region 160.

On the other hand, in the exemplary embodiment, the conductor chip 110 is mounted above the second region 160 of the wiring 112, and the conductor chip 110 has a fixed electric potential. Therefore, in the second region, the conductor chip 110 functions as an electric conductor reference plane, and the wiring 112 and the conductor chip 110 constitute the microstrip line. Therefore, the characteristic impedance in the second region 160 becomes a value Z(h1) obtained by substituting h1 that is a distance between the conductor chip 110 and the wiring 112 into the above formulae, (Formula 1), (Formula 3), and (Formula 4). Since h1 and h2 are substantially equal to each other, $Z(h2) \cong Z(h1)$ holds, that is, the excellent impedance matching between the first region 150 and the second region 160 can be obtained.

Next, an effect of the exemplary embodiment will be explained. In this exemplary embodiment, the conductor chip 110 is mounted above the second region 160 of the wiring 112, and the conductor chip 110 has a fixed electric potential. Therefore, since in the second region, the conductor chip 110 functions as the electric conductor reference plane, matching of the characteristic impedance can be achieved over the whole length of the wiring. By this capability, it is possible to input a stable desired signal into the semiconductor chip by controlling reflection and noises by the impedance matching.

In this exemplary embodiment, the semiconductor chip 120 can be an LSI that has a function of a logic circuit. Since the LSI having the function of a logic circuit is required to perform high-speed operations, it is significantly affected by reflection caused by a difference in the characteristic impedance in particular. Therefore, the semiconductor device of the exemplary embodiment that can achieve matching of the characteristic impedance over the whole length of the wiring demonstrates an especially excellent effect in the case where the LSI having the function of a logic circuit is mounted thereon.

Moreover, in this exemplary embodiment, when the conductor chip 110 placed close to the-wiring is used as the electric conductor reference plane, the inductance becomes small because of (Formula 4), and the capacitance becomes large because of (Formula 3). Therefore, wiring with a thinner wiring width becomes possible. By this capability, wiring density improves, and flexibility in a wiring design also improves.

Moreover, in this exemplary embodiment, even if the power supply/ground layer is not provided in the wiring layer in the inside of the wiring board 102, the impedance control becomes possible by making the electric conductor 110 that is mounted act as the electric conductor reference plane. For this reason, the number of the wiring layers of the wiring board 102 can be reduced. By this capability, this exemplary embodiment is also advantageous for cost reduction.

Moreover, in this exemplary embodiment, the characteristic impedance can also be made to change into a desired value by mounting the conductor chip 110 on the wiring board, such as the interposer and the printed circuit board that are existing. For example, by controlling the outer shape of the conductor chip 110, the thicknesses or dielectric constants of the mount material and the solder resist under the conductor chip 110, a desired region can be easily designed to have a desired value. By this capability, it is possible to control generation of EMI emission noise.

Further, in this exemplary embodiment, it is also effective to improve coplanarity in the semiconductor device with a SiP structure by taking into consideration symmetry of arrangement of the semiconductor chips 120, 121 and the conductor chip 110 so that camber may reduce.

(Second Exemplary Embodiment)

Figure 7:
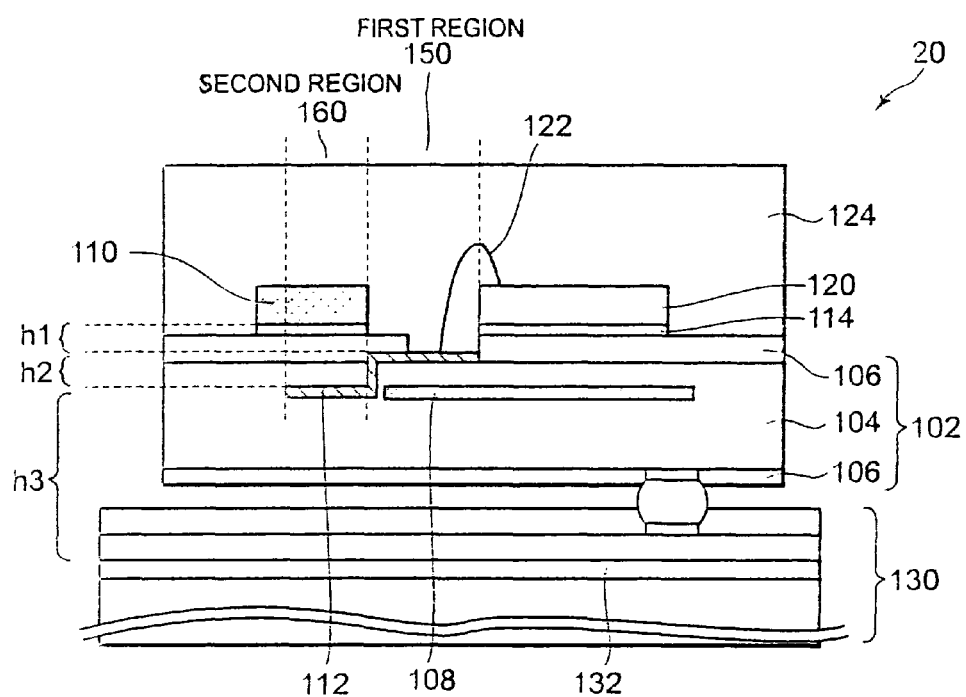
FIG. 7 illustrates a sectional view showing a second exemplary embodiment of a semiconductor device according to the present invention.

FIG. 7 is a sectional view showing a configuration of a semiconductor device 20 of a second exemplary embodiment. The plan view of the semiconductor device 20 is the same as that of FIG. 1 of the first exemplary embodiment.

In the semiconductor device 20, at least a part of the wiring 112 is provided in a surface layer of the wiring board 102. In FIG. 7, the wiring 112 is provided on a rear surface layer of the wiring board 102, and is further provided on the same wiring layer as that of the electric conductor reference plane 108. In the second region 160 in FIG. 7, a distance H' between the conductor chip 110 that acts as the electric conductor reference plane and the wiring 112 becomes H'=h1+h2. Since h1 is roughly equivalent to the thickness of the mount material 114 and the thickness of the solder resist 106, Z(h2) may be considered as $Z(h2) \cong Z(H')$. Therefore, the semiconductor device 20 having an excellent transmission characteristic such that the impedance matching is achieved over the whole length of the wiring and the wiring board can be provided. In this exemplary embodiment, other effects in the first exemplary embodiment can also be attained.

(Third Exemplary Embodiment)

Figure 8:
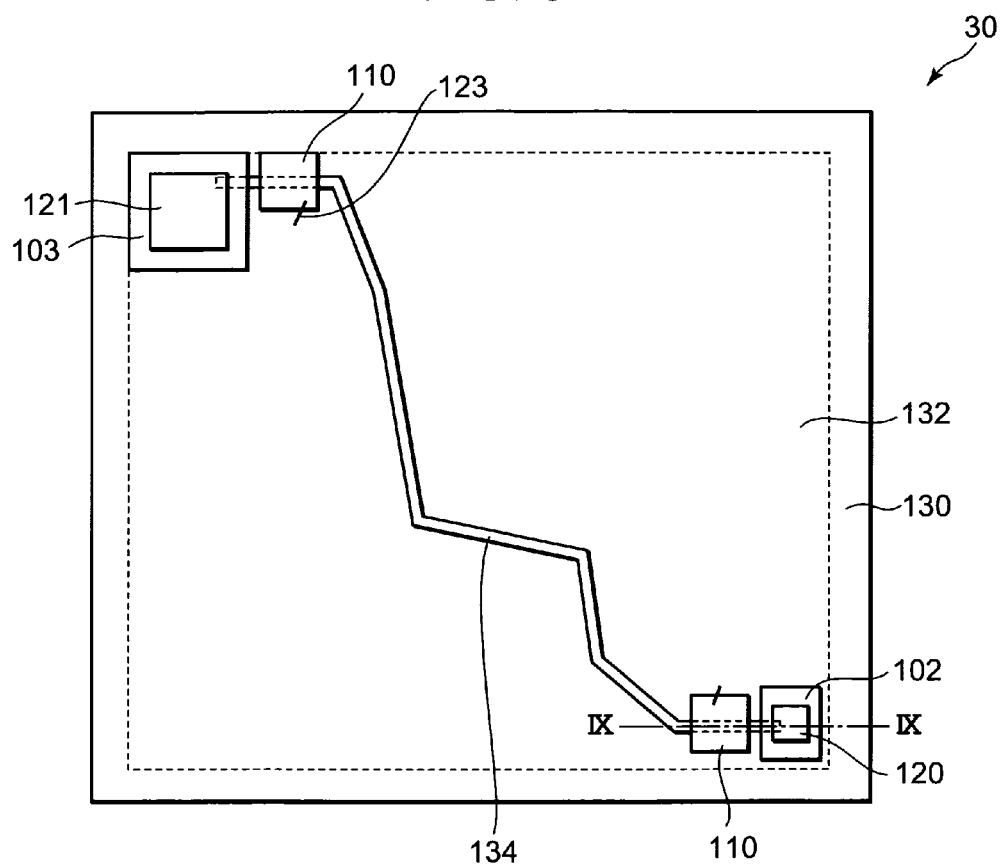
FIG. 8 illustrates a plan view showing a third exemplary embodiment of a semiconductor device according to the present invention.
Figure 9:
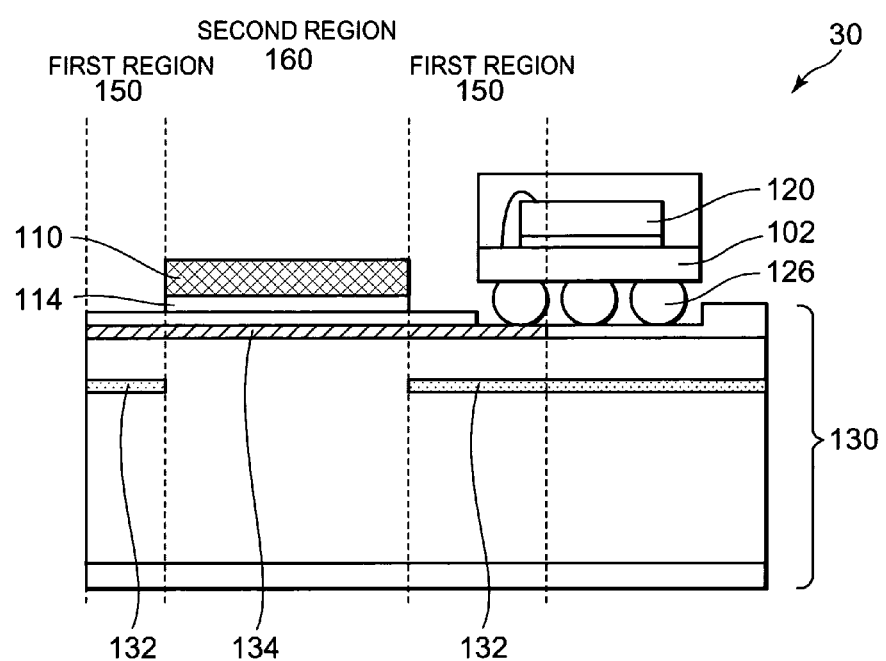
FIG. 9 illustrates a sectional view showing the third exemplary embodiment of the semiconductor device according to the present invention.

Although the examples that each used the interposer as the wiring board were shown in the first exemplary embodiment and the second exemplary embodiment, the wiring board in the present invention may be the printed circuit board. FIG. 8 is a sectional view showing a semiconductor device according to a third exemplary embodiment of the present invention. FIG. 9 is a sectional view taken along the line IX-IX in FIG. 8.

The semiconductor chip 120 and the semiconductor chip 121 are flip-chip mounted on the printed circuit board 130 with intermediates of, the interposer 120 and the interposer 121, respectively. On the printed circuit board 130, the conductor chip 110 and the conductor chip 111 are mounted with the mount material 114.

The printed circuit board 130 has the electric conductor reference plane 132 provided in a part of the internal wiring layer. In this exemplary embodiment, the electric conductor reference plane 132 is a ground layer.

Moreover, the printed circuit board 130 is equipped with at least a single wiring 134. The wiring 134 is a signal line. As shown in FIG. 8 and FIG. 9, in top view, the wiring 134 includes the first region 150 that overlaps the electric conductor reference plane 132 and the second region 160 that is the whole region except for it. Although only one wiring 134 is shown in FIG. 8 for simplification, generally the actual semiconductor device has a plurality of wirings.

Above the second region 160 on the surface of the printed circuit board 130, the conductor chip 110 and the conductor chip 111 are mounted. The conductor chips 110, 111 have fixed electric potentials. Specifically, they are connected to the ground potential via a wire 123 and the wiring (not illustrated) like the first exemplary embodiment.

As shown in FIG. 8 and FIG. 9, in the first region 150, the wiring 134 and the electric conductor reference plane 132 constitute the microstrip line. On the other hand, in the second region, the wiring 134 and the conductor chip 110 constitute the microstrip line. Therefore, the semiconductor device and the wiring board in this exemplary embodiment have the same effect as that of the semiconductor device of the first or second exemplary embodiment.

Figure 10:
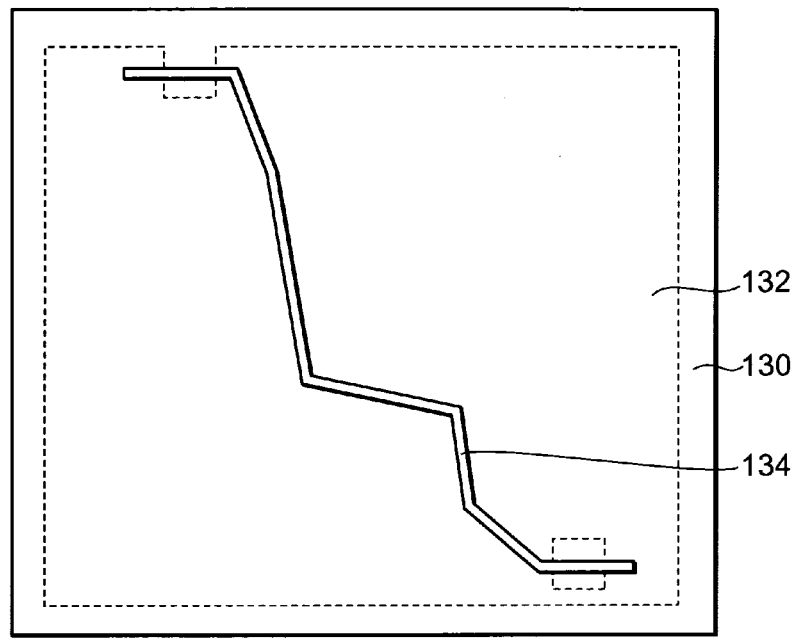
FIG. 10 illustrates a plan view showing the third exemplary embodiment of a wiring board according to the present invention.
Figure 11:
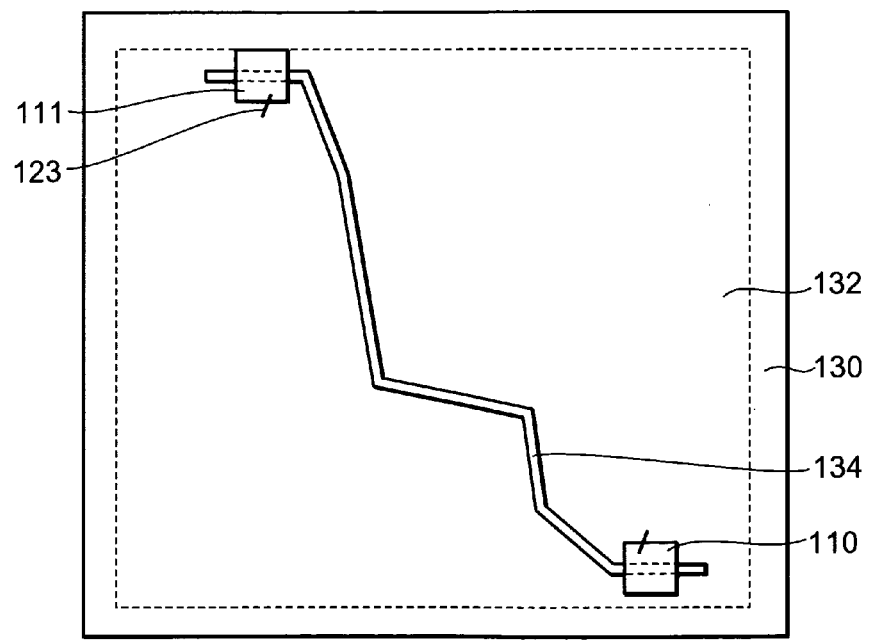
FIG. 11 illustrates a plan view showing the third exemplary embodiment of the wiring board according to the present invention.

Next, a configuration of the printed circuit board in this exemplary embodiment will be explained in detail using FIG. 10 and FIG. 11. FIG. 10 is a plan view of the wiring board before the interposer and the conductor chip are mounted. FIG. 11 is a plan view of the wiring board after the conductor chip was mounted. In FIG. 10 and FIG. 11, the electric conductor reference plane 132 is provided in a part of the wiring layer in the inside of the printed circuit board 130 in a region shown by dotted lines. As shown in FIG. 10, a defective part exists in the electric conductor reference plane 132. As shown in FIG. 11, above the second region 160, the conductor chip 110 and the conductor chip 111 are mounted.

Figure 12:
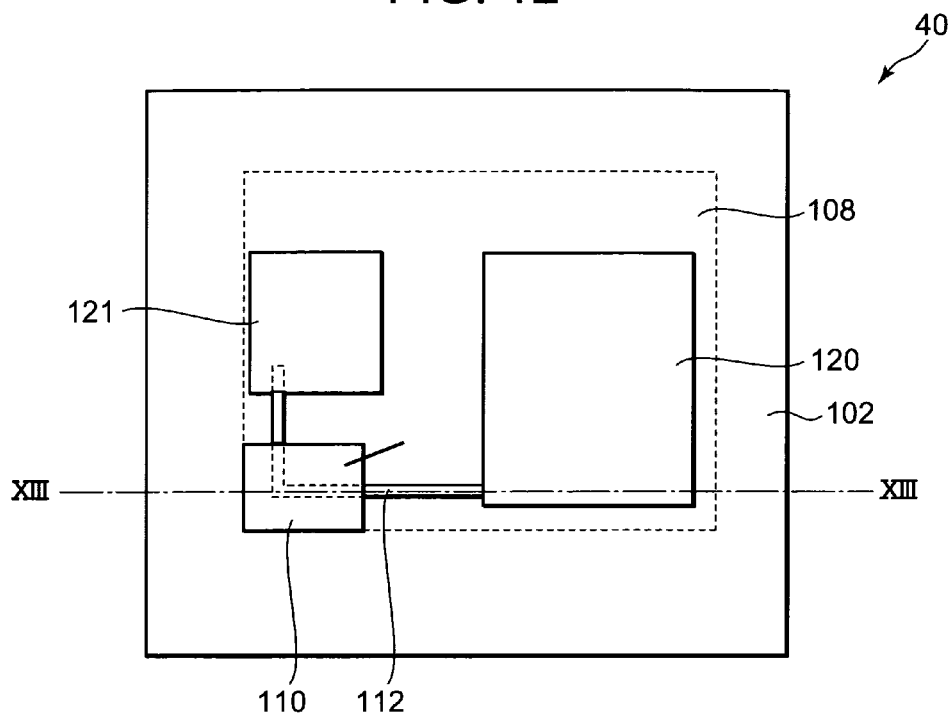
FIG. 12 illustrates a plan view showing a modification of the exemplary embodiment.
Figure 13:
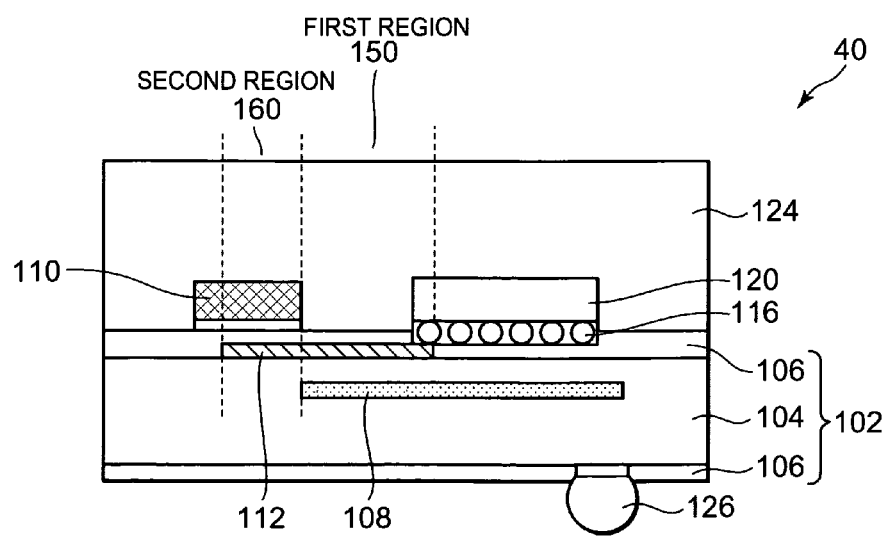
FIG. 13 illustrates a sectional view showing the modification of the exemplary embodiment.

The semiconductor device according to the present invention is not restricted to the above-mentioned exemplary embodiments, but can be modified variously. For example, although the above-mentioned exemplary embodiment exemplified the semiconductor device on the interposer 130 in which the semiconductor chip 120 was mounted on the wiring board that was the interposer with an intermediate of the mount material, the semiconductor chip 120 may be flip-chip connected onto the interposer 102. FIG. 12 is a plan view showing a configuration of a semiconductor device 40 when the semiconductor chip 120 is flip-chip connected, and FIG. 13 is a sectional view taken along the line XIII-XIII of FIG. 12. By mounting the conductor chip 110 above the second region 160, the characteristic impedance can be matched over the whole length of the wiring 112.

Moreover, although in the exemplary embodiment described above, the example where the conductor chip 110 was connected to the ground potential or the power supply potential via the wire 122 was shown, the conductor chip 110 may be flip-chip connected to be connected to the ground potential or the power supply potential via the wiring.

Figure 14:
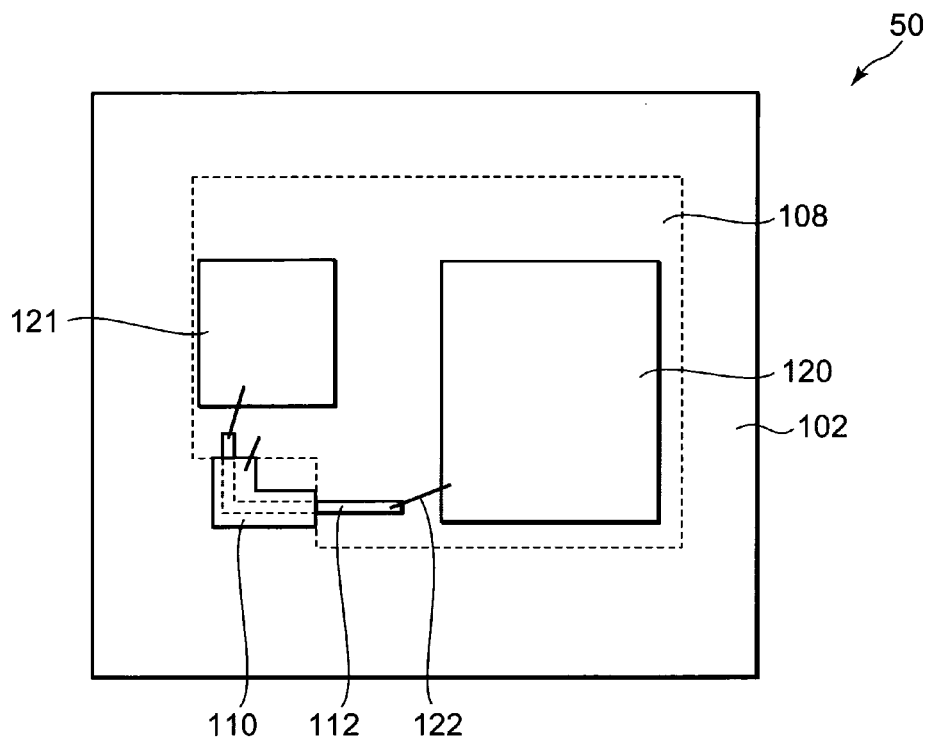
FIG. 14 illustrates a plan view showing a modification of the exemplary embodiment.

Moreover, although in the semiconductor device of the exemplary embodiment described above, the example where the conductor chip 110 covers the whole of the defective part of the electric conductor reference plane 108, as far as the conductor chip 110 is mounted only above the second region 160 of the wiring 112, the shape is not limited. For example, even if the conductor chip 110 of a shape as shown in FIG. 14 is mounted, the effect of the present invention can be achieved.

Further, it is noted that, Applicant's intent is to encompass equivalents of all claim elements, even if amended later during prosecution.

What is claimed is:

1. A semiconductor device, comprising:
a wiring board;
a semiconductor chip mounted on the wiring board;
an electric conductor reference plane provided in the wiring board;
a wire, in a top view, including a first region that overlaps the electric conductor reference plane and a second region located outside the first region; and
a conductor chip mounted above the second region,
wherein, in the top view, the wire including the second region overlaps the conductor chip, and
wherein, in a cross sectional view, a distance between the wire and the electric conductor reference plane in the first region is substantially equal to a distance between the wire and the conductor chip in the second region.

2. The semiconductor device according to claim 1, wherein in the first region, the wire and the electric conductor reference plane constitute a first microstrip line, and
wherein in the second region, the wiring and the conductor chip constitute a second microstrip line.

3. The semiconductor device according to claim 1, wherein the electric conductor reference plane comprises one of a ground layer and a power supply layer.

4. The semiconductor device according to claim 1, wherein the conductor chip comprises a fixed electric potential layer.

5. The semiconductor device according to claim 4, wherein the fixed electric potential layer comprises one of a ground layer and a power supply layer.

6. The semiconductor device according to claim 1, wherein the wire is provided on a surface of the wiring board.

7. The semiconductor device according to claim 1, wherein the wiring board comprises an interposer.

8. The semiconductor device according to claim 1, wherein, in the top view, the wire including the second region crosses a side surface of the conductor chip and after overlapping the conductor chip, the wire including the second region crosses another side surface of the conductor chip.

9. The semiconductor device according to claim 1, wherein, in the top view, a side surface of the electric conductor reference plane abuts a side surface of the conductor chip, and another side surface of the electric conductor reference plane abuts another side surface of the conductor chip.

10. The semiconductor device according to claim 9, wherein said another side surface of the electric conductor reference plane is adjacent to said side surface of the electric conductor reference plane, and said another side surface of the conductor chip is adjacent to said side surface of the conductor chip,
wherein a first intersection of the wire with said side surface of the conductor chip is located away from a corner intersection that is formed by said another side surface of the conductor chip and said side surface of the conductor chip, and
wherein a second intersection of the wire with said another side surface of the conductor chip is located away from said corner intersection that is formed by said another side surface of the conductor chip and said side surface of the conductor chip.

11. A wiring board, comprising:
an electric conductor reference plane in an inside of the wiring board;
a wire, in a top view, including a first region that overlaps the electric conductor reference plane and a second region located outside the first region; and
a conductor chip mounted above the second region,
wherein a semiconductor chip is mounted on the wiring board;
wherein, in the top view, the wire including the second region overlaps the conductor chip, and
wherein, in a cross sectional view, a distance between the wire and the electric conductor reference plane in the first region is substantially equal to a distance between the wire and the conductor chip in the second region.

12. The wiring board according to claim 11, wherein in the first region, the wire and the electric conductor reference plane constitute a first microstrip line, and
wherein in the second region, the wiring and the conductor chip constitute a second microstrip line.

13. The wiring board according to claim 11, wherein the electric conductor reference plane comprises one of a ground layer and a power supply layer.

14. The wiring board according to claim 11, wherein the conductor chip comprises a fixed electric potential layer.

15. The wiring board according to claim 14, wherein the fixed electric potential layer comprises one of a ground layer and a power supply layer.

16. The wiring board according to claim 11, wherein the wire is provided on a surface of the wiring board.

17. The wiring board according to claim 11, wherein, in the top view, a side surface of the electric conductor reference plane aligned with a side surface of the conductor chip, and another side surface of the electric conductor reference plane aligned with another side surface of the conductor chip.

18. A semiconductor device, comprising:
a wiring board;
an electric conductive plate, for being supplied with a fixed potential, formed in the wiring board;
a first semiconductor chip formed on the wiring board to overlap with the electric conductive plate;
a second semiconductor chip formed on the wiring board to overlap with the electric conductive plate;

a wire connected between the first and second semiconductor chips and formed on the wiring board, the wire including first portions overlapping with the electric conductive plate and a second portion located outside the first portions and overlapping the a conductive chip;

an insulating layer formed on the second portion of the wire; and the conductive chip formed on the insulating layer, for being supplied with the fixed potential, wherein, in a cross sectional view, a distance between the wire and the electric conductor plate in the first portions is substantially equal to a distance between the wire and the conductive chip in the second portion.

19. The semiconductor device as claimed in claim 18, wherein, in a top view, the wire including the second region overlaps the conductive chip.

* * * * *